(12) United States Patent
Lai et al.

(10) Patent No.: US 9,070,687 B2
(45) Date of Patent: Jun. 30, 2015

(54) SEMICONDUCTOR DEVICE WITH SELF-PROTECTING FUSE

(71) Applicant: Taiwan Semiconductor Manufacturing Co., Ltd., Hsinchu (TW)

(72) Inventors: Chen-Chung Lai, Hsinchu County (TW); Kang-Min Kuo, Zhubei (TW); Yen-Ming Peng, Zhongli (TW); Gwo-Chyuan Kuoh, Hsinchu (TW); Han-Wei Yang, Hsinchu (TW); Yi-Ruei Lin, Taipei (TW); Chin-Chia Chang, Zhongli (TW); Ying-Chieh Liao, Taipei (TW); Che-Chia Hsu, Taoyuan (TW); Bor-Zen Tien, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 13/930,161

(22) Filed: Jun. 28, 2013

(65) Prior Publication Data

US 2015/0001592 A1    Jan. 1, 2015

(51) Int. Cl.
*H01L 23/52* (2006.01)
*H01L 23/525* (2006.01)
*H01L 21/306* (2006.01)

(52) U.S. Cl.
CPC .......... *H01L 23/5256* (2013.01); *H01L 21/306* (2013.01)

(58) Field of Classification Search
CPC .......................... H01L 21/306; H01L 23/5256
USPC .............. 257/529, E21.592, E23.149, E23.15
See application file for complete search history.

(56) References Cited

U.S. PATENT DOCUMENTS

| | | | | |
|---|---|---|---|---|
| 6,261,937 B1* | 7/2001 | Tobben et al. | ............... | 438/601 |
| 6,559,042 B2* | 5/2003 | Barth et al. | ................... | 438/601 |
| 6,858,914 B2* | 2/2005 | Nanjo et al. | .................. | 257/529 |
| 7,132,720 B2* | 11/2006 | Yoshizawa et al. | ........... | 257/409 |
| 7,419,856 B2* | 9/2008 | Kim | .............................. | 438/132 |
| 7,667,246 B2* | 2/2010 | Kim | .............................. | 257/209 |
| 7,759,798 B2* | 7/2010 | Chibahara et al. | ............. | 257/758 |
| 7,772,108 B2* | 8/2010 | Son et al. | ...................... | 438/618 |
| 7,888,769 B2* | 2/2011 | Kondo et al. | ................. | 257/529 |
| 8,436,424 B2* | 5/2013 | Ikeda | ............................. | 257/350 |
| 8,513,808 B2* | 8/2013 | Hotta et al. | ..................... | 257/758 |
| 8,541,264 B2* | 9/2013 | Lin et al. | ....................... | 438/132 |

(Continued)

FOREIGN PATENT DOCUMENTS

| | | |
|---|---|---|
| JP | 2007-019264 A | 1/2007 |
| KR | 10-2001-0095178 A | 11/2001 |
| KR | 10-2005-0057262 A | 6/2005 |

*Primary Examiner* — Ida M Soward
(74) *Attorney, Agent, or Firm* — Maschoff Brennan

(57) ABSTRACT

A semiconductor device with the metal fuse is provided. The metal fuse connects an electronic component (e.g., a transistor) and a existing dummy feature which is grounded. The protection of the metal fuse can be designed to start at the beginning of the metallization formation processes. The grounded dummy feature provides a path for the plasma charging to the ground during the entire back end of the line process. The metal fuse is a process level protection as opposed to the diode, which is a circuit level protection. As a process level protection, the metal fuse protects subsequently-formed circuitry. In addition, no additional active area is required for the metal fuse in the chip other than internal dummy patterns that are already implemented.

20 Claims, 8 Drawing Sheets

(56) References Cited

U.S. PATENT DOCUMENTS

| | | |
|---|---|---|
| 2003/0205787 A1 | 11/2003 | Okada |
| 2004/0056322 A1 | 3/2004 | Friese et al. |
| 2007/0170544 A1* | 7/2007 | Koike .......................... 257/529 |
| 2008/0265366 A1* | 10/2008 | Guo et al. .................... 257/529 |
| 2015/0029777 A1* | 1/2015 | Chung, Shine C. ............ 365/96 |

* cited by examiner

SEMICONDUCTOR DEVICE WITH SELF-PROTECTING FUSE

BACKGROUND

Consumer demand for smaller electronic devices has led to various miniaturization efforts in the field of semiconductor manufacturing. With the miniaturization, plasma process, e.g., plasma etching or deposition processes, are increasingly applied in the manufacturing process of an integrated circuit (IC) chip. Plasma includes ions that flow through the material being processed, for example, to the thin oxide under a gate structure. The thin oxide may breakdown or it may degrade and cause a threshold voltage (Vt) to shift for a transistor. When the threshold voltage shifts, under same conditions a saturating current for affected transistors is smaller than transistors that are not so damaged by the plasma current. As such, plasma-induced damage (PID) can cause parameter degradation of MOSFETs.

Protection such as diodes may be applied to protect the IC from the PID; however, additional active area for the protection diode layout in a chip is unfavorable to the miniaturization. Further, such circuit level protection may not provide protection during manufacturing. Current solutions to the PID issue are not satisfactory in every aspect.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
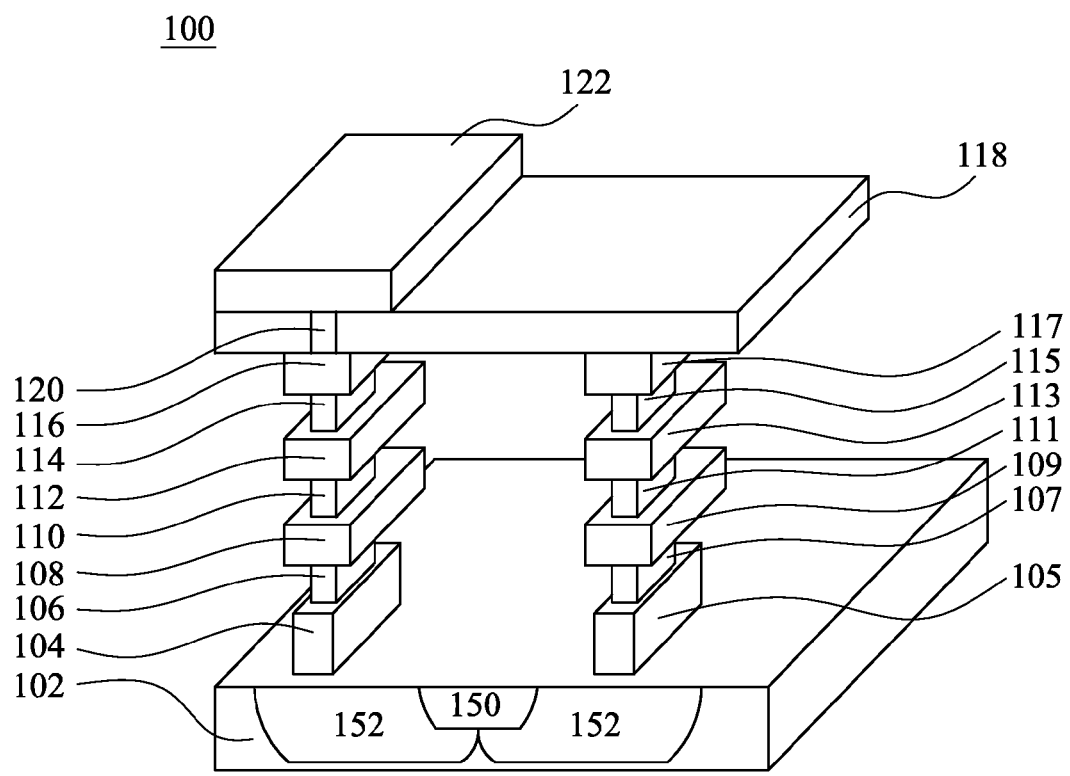
FIG. 1 is a perspective view of a semiconductor device from the prior art.

The present disclosure is described by the following embodiments. It is understood that the following disclosure provides many different embodiments, or examples, for implementing different features of various embodiments. Specific examples of components and arrangements are described below to simplify the present disclosure. Those with ordinary skill in the art can readily understand the other advantages and functions of the present disclosure after reading the present disclosure. These are, of course, merely examples and are not intended to be limiting. Various details described in the specification can be modified based on different viewpoints and applications without departing from the scope of the present disclosure.

For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, the singular forms "a," "an" and "the" include plural referents unless the context clearly dictates otherwise. Therefore, reference to, for example, a gate stack includes aspects having two or more such gate stacks, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

According to various embodiments of the present disclosure, a semiconductor device with the metal fuse is provided. The metal fuse connects an electronic component (e.g., a transistor) and a existing dummy feature which is grounded. The protection of the metal fuse can be designed to start at the beginning of the metallization formation processes. The grounded dummy feature provides a path for the plasma charging to the ground during the entire back end of the line (BEOL) process. The metal fuse is a process level protection as opposed to the diode, which is a circuit level protection. As a process level protection, the metal fuse protects subsequently-formed circuitry. In addition, no additional active area is required for the metal fuse in the chip other than internal dummy patterns that are already implemented.

FIG. 1 is a perspective view of a semiconductor device 100 from the prior art. The semiconductor device 100 includes a substrate 102 which has a gate stack 104 deposited on an active region 152 of the substrate 102. In the manufacture of the semiconductor device, a dummy gate stack 105 is inserted along with the gate stack 104 to reduce localized effects that result from having patterns of varying densities. Adding the dummy gate stack 105 helps to meet the extremely tight requirement in terms of process control for STI etch, polish and channel length definition an interlayer dielectric (ILD) planarization. An isolation region 150 is formed in the substrate 102 to isolate the active region 152 under the gate stack 104 and the dummy gate stack 105. An interconnect structure is formed over the substrate 102. The interconnect structure includes an ILD and a multilayer interconnect structure, which includes contacts (106, 107), vias (110, 111, 114, 115) and metal lines (108, 109, 112, 113, 116, 117) in metal layers. It is noted that, in the semiconductor device 100, the electrical contact 107 is off-set from the dummy gate stack 105. A passivation layer 118 with a via or RDL 120 therein is over the top metal layer 116 and 117, and a metal pad is formed on the passivation 118. Due to lack of protection from the plasma charging in etching the metal lines and/or the metal pad, the PID effect can damage the gate dielectric in the gate stack 104.

Figure 2A:
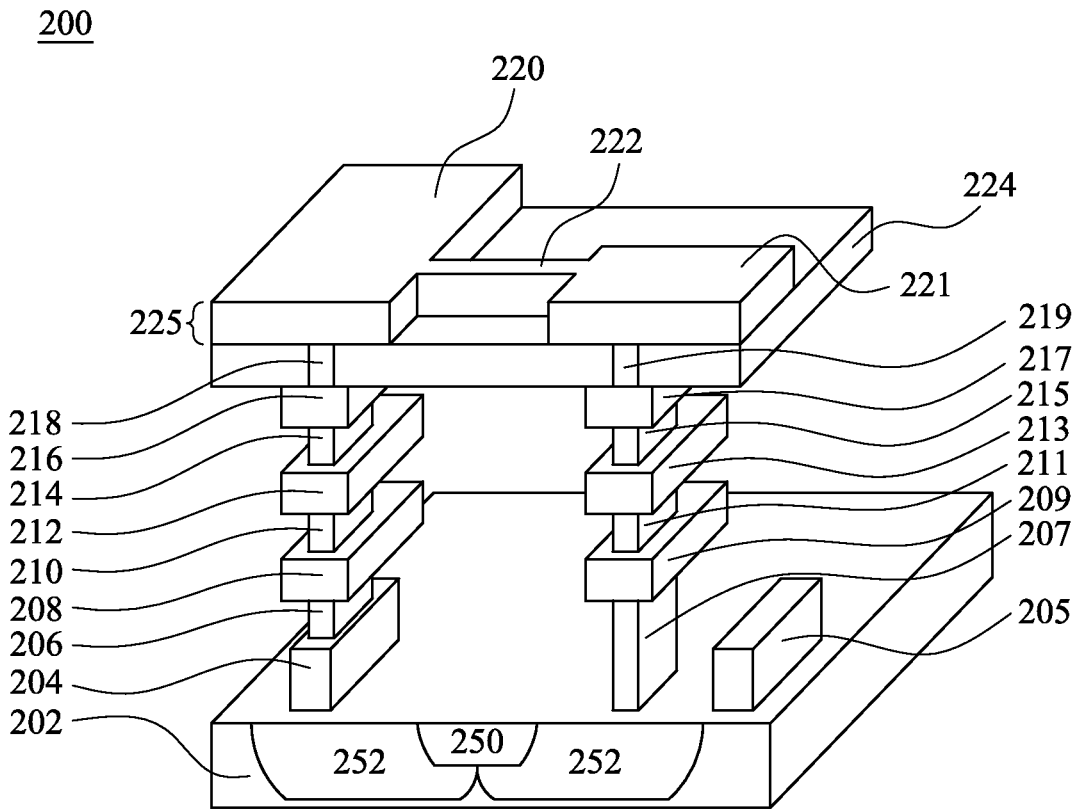
FIG. 2A is a perspective view of a part of a semiconductor device according to various embodiments of the present disclosure.

FIG. 2A is a perspective view of a part of a semiconductor device 200 according to various embodiments of the present disclosure. The semiconductor device 200 includes a substrate 202 with a gate stack 204 deposited on an active region 252 of the substrate 202. In the fabrication of the semiconductor device 200, a dummy feature (e.g., a dummy gate stack 205) is globally and uniformly inserted along with the gate stack 204 to reduce localized effects. An isolation region 250 is formed in the substrate 202 to isolate the active region 252 under the gate stack 204 and the dummy gate stack 205. An interconnect structure is formed over the substrate 202. The interconnect structure includes an ILD and a multilayer interconnect structure, which includes electrical contacts (206, 207), vias (210, 211, 214, 215) and metal lines (208, 209, 212, 213, 216, 217) in metal layers. A first electrical contact 206 is formed on the gate stack 204 and a second electrical contact 207 is formed and electrically connected to the grounded dummy feature in the substrate 202. The second electrical contact 207 is off-set from the dummy gate stack 205. A passivation layer 224 is deposited over the top metal layer 216 and 217, and a metal pad layer is formed on the passivation 224. The metal pad layer 225 includes a first metal pad 220 in contact with the metal line 218, and a second metal pad 221 in contact with the metal line 219. A metal fuse 222 is disposed between and connects the first metal pad 220 and the second metal pad 221. The metal fuse 222 provides a path for the plasma charge during etching process of the pads/RDL to the grounded dummy feature.

Figure 2B:
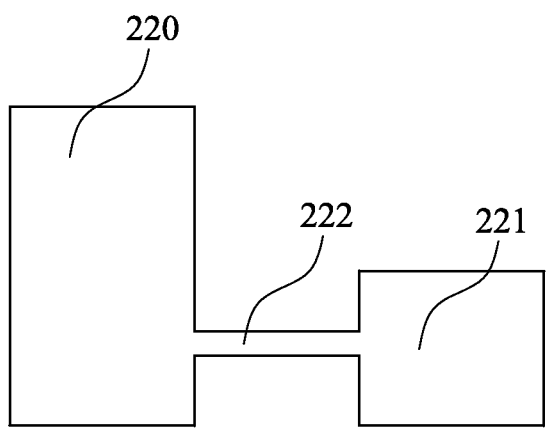
FIG. 2B is a schematic top view of a metal pad layer of a semiconductor device according to various embodiments of the present disclosure.

FIG. 2B is a schematic top view of a metal pad layer of the semiconductor device 200 of FIG. 2A according to various embodiments of the present disclosure. The metal fuse 222 is one-fifth to one-tenth of the metal features, e.g., the first metal pad 220). The distance between adjacent sides (i.e., the first metal pad 220 and the second metal pad 221) varies. Further, the metal fuse 222 can have varying widths along the fuse length or include a bottle neck. The metal fuse 222 is made of the material same as or different from that of the metal pad layer 225. As various embodiments, the metal fuse is made of aluminum (Al), copper (Cu), AlCu, or metal/alloy with suitable resistance.

Figure 3A:
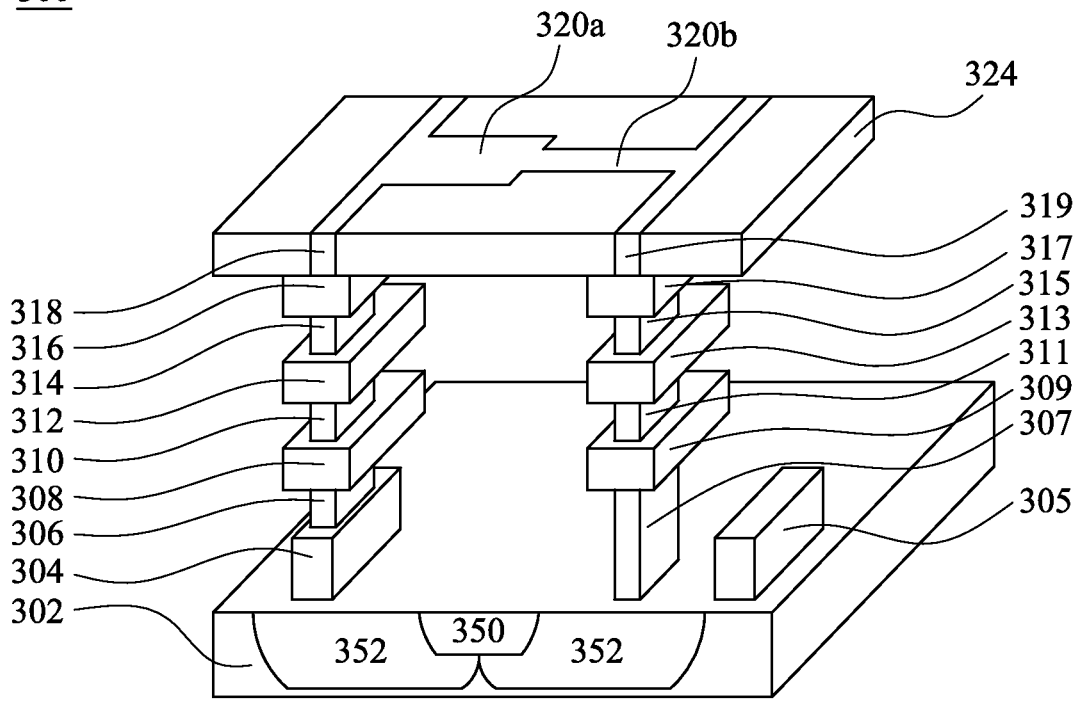
FIG. 3A is a perspective view of a part of a semiconductor device according to various embodiments of the present disclosure.

FIG. 3A is a perspective view of a part of a semiconductor device according to various embodiments of the present disclosure. The semiconductor device 300 includes a substrate 302 with a gate stack 304 deposited on an active region 352 of the substrate 302. In the fabrication of the semiconductor device 300, a dummy feature (e.g., a dummy gate stack 305) is globally and uniformly inserted along with the gate stack 304 to reduce localized effects. An isolation region 350 is formed in the substrate 302 to isolate the active region 352 under the gate stack 304 and the dummy gate stack 305. An interconnect structure is formed over the substrate 300. The interconnect structure includes an ILD and a multilayer interconnect structure, which includes electrical contacts (306, 307), vias (310, 311, 314, 315) and metal lines (308, 309, 312, 313, 316, 317) in metal layers. A first electrical contact 306 is formed on the gate stack 304 and a second electrical contact 307 is formed and electrically connected to the grounded dummy feature in the substrate 302. The second electrical contact 307 is off-set from the dummy gate stack 305. A passivation layer 324 is deposited over the top metal layer 316 and 317, and a RDL is formed in the passivation 324. The RDL includes a first metal pattern 318 in contact with the top metal layer 316, and a second metal pattern 319 in contact with the top metal layer 317. A metal fuse 320$b$ is disposed between and connects the first metal pad 318 and the second metal pad 319. The metal fuse 320$b$ provides a path for the plasma charge during etching process of the metal pads/RDL to the grounded dummy feature.

Figure 3B:
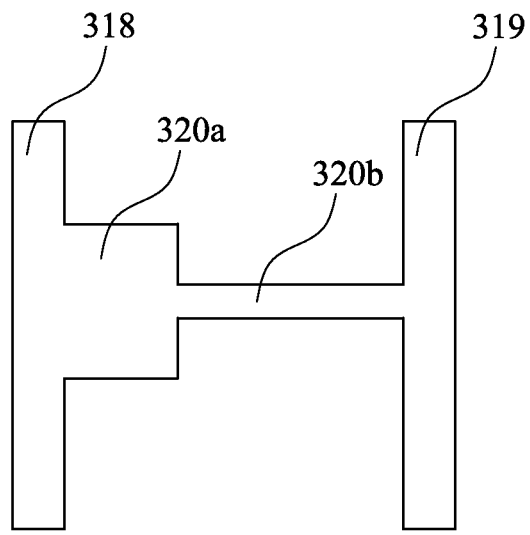
FIG. 3B is a schematic top view of a metal pad layer of a semiconductor device according to various embodiments of the present disclosure.

FIG. 3B is a schematic top view of a RDL layer in the passivation layer 324 of a semiconductor device 300 according to various embodiments of the present disclosure. The distance between adjacent sides (i.e., the first metal pad 318 and the second metal pad 319) varies. Further, the fuse 320 $b$ can have varying widths along the fuse length or include a bottle neck. For example, a portion of 320$a$ may be introduced between the first metal pad 318 and the metal fuse 320$b$ to adjust the length of the metal fuse 320$b$.

Figure 4A:
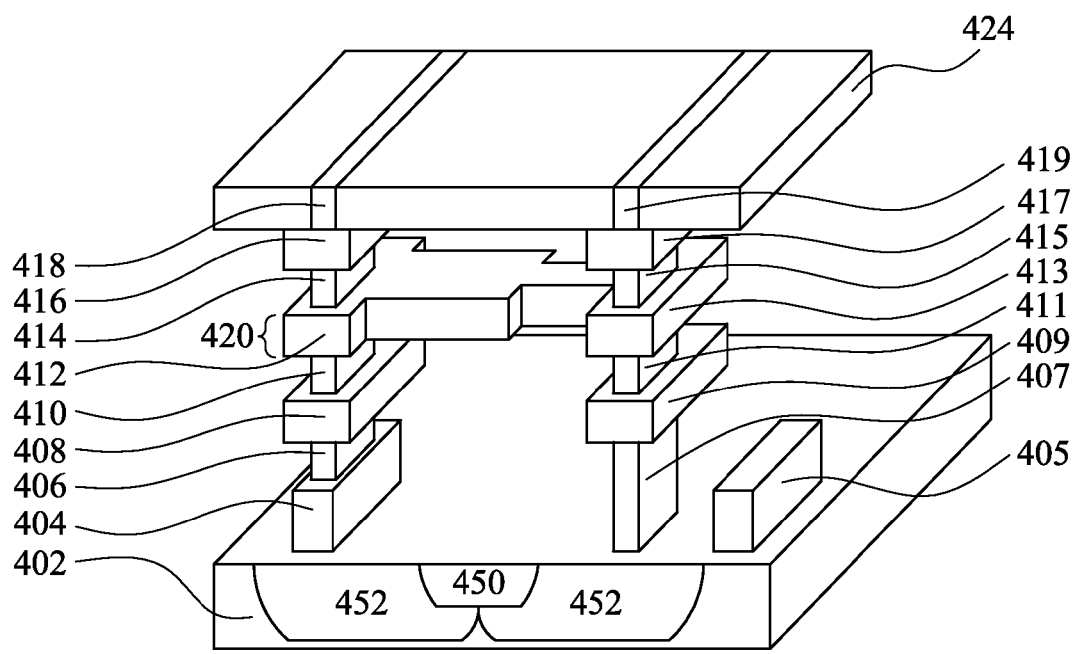
FIG. 4A is a perspective view of a part of a semiconductor device according to various embodiments of the present disclosure.

FIG. 4A is a perspective view of a part of a semiconductor device according to various embodiments of the present disclosure. The semiconductor device 400 includes a substrate 402 with a gate stack 404 deposited on an active region 452 of the substrate 402. In the fabrication of the semiconductor device 400, a dummy feature (e.g., a dummy gate stack 405) is globally and uniformly inserted along with the gate stack 404 to reduce localized effects. An isolation region 450 is formed in the substrate 402 to isolate the active region 452 under the gate stack 404 and the dummy gate stack 405. An interconnect structure is formed over the substrate 400. The interconnect structure includes an ILD and a multilayer interconnect structure, which includes electrical contacts (406, 407), vias (410, 411, 414, 415) and metal lines (408, 409, 412, 413, 416, 417) in metal layers. A first electrical contact 406 is formed on the gate stack 404 and a second electrical contact 407 is formed and electrically connected to the grounded dummy feature in the substrate 402. The second electrical contact 407 is off-set from the dummy gate stack 405. A passivation layer 424 is deposited over the top metal layer 416 and 417. The metal passivation layer 424 includes a first metal pad 420 in contact with the metal line 418, and a second metal pad 421 in contact with the metal line 419. A metal fuse 430$b$ is disposed between and connects a first metal pattern 412 of a metal layer 2 (420) and the second metal pattern 413. The metal fuse 430$b$ provides a path for the plasma charge during etching process of the metal lines/pads/RDL to be the grounded metal feature. It is understood that, though the metal fuse 430$b$ is a formed between the first metal pattern 412 and the second metal pattern 413 of the metal 2 layer (M2), the metal fuse may be formed in any of the subsequent metallization layer (i.e. Mx) including the top metal layer according to various embodiments of the present disclosure.

Figure 4B:
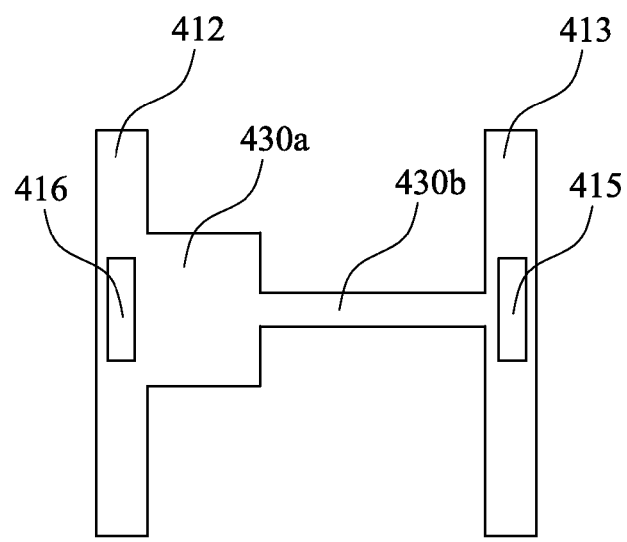
FIG. 4B is a schematic top view of a metal pad layer of a semiconductor device according to various embodiments of the present disclosure.

FIG. 4B is a schematic top view of a metal pad layer of a semiconductor device according to various embodiments of the present disclosure. The metal fuse 430$b$ is one-fifth to one-tenth of the metal features, e.g., the first metal pattern 412). The distance between adjacent sides (i.e., the first metal pad 412 and the second metal pad 413) varies. Further, the metal fuse 430$b$ can have varying widths along the fuse length or include a bottleneck. The metal fuse 430$b$ is made of the material same as or different from that of the metal layer. As various embodiments, the metal fuse is made of Al, Cu, AlCu, or metal/alloy with suitable resistance.

The metal fuses illustrated in FIGS. 2 to 4 may be broken intentionally broken or removed through a wet or dry etching process, or be blown from the plasma charging in the fabrication. In particular, in the fabrication of the semiconductor device according to various embodiments of the present disclosure, the charges accumulated from the ions introduced by the plasma process may be directed to the grounded dummy feature through the metal fuse and blow it. On the other hand, the metal fuse may be intentionally broken or removed by the wet or dry etching process after the completion of the layer where the metal fuse locates.

Figure 5A:
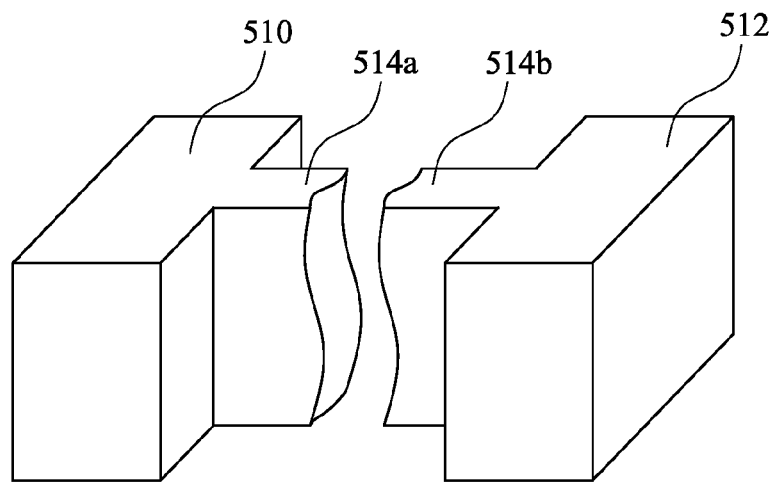
FIGS. 5A-C are perspective views of broken metal fuses of a deposition layer of a semiconductor device according to various embodiments of the present disclosure.
Figure 5B:
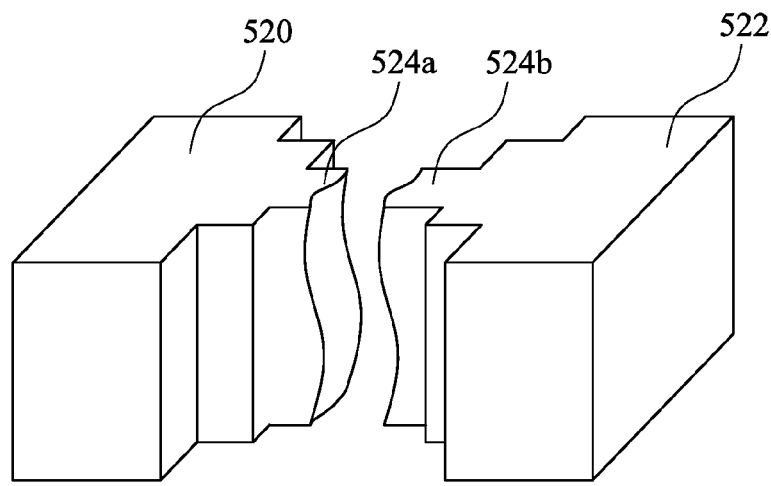
Figure 5C:
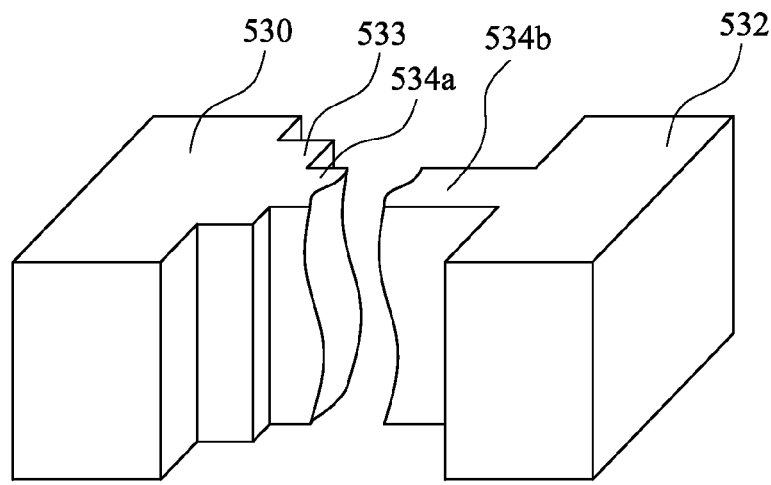

FIGS. 5A-C are perspective views of broken metal fuses of a layer of a semiconductor device according to various embodiments of the present disclosure. As mentioned above, the distance of the metal fuse between adjacent sides (i.e., 510, 512; 520, 522; 530, 532) varies. Further, the metal fuse can have varying widths along the fuse length or include a bottleneck. Referring to FIG. 5A, a metal fuse with the same thickness dimension as the metal line, which is a metal pad/RDL, is broken into two matching stubs 514a and 514b connecting to the metal pads 510 and 512, respectively. Referring to FIG. 5B, a metal fuse with the same thickness dimension as that of the metal line, which is a metal layer, is broken into two matching stubs 524a and 524b connecting to the metal lines 520 and 522, respectively. A portion of the metal fuse 520 and 522 each with a transitional dimension are formed between another portion of the metal fuse 524a and 524b, to control the lengths of the stubs 524a and 524b. Referring to FIG. 5C, a metal fuse with the same thickness dimension as the metal line, which may be in any metal line/metal pad/RDL, is broken into two matching stubs 534a and 534b connecting to the metal lines 530 and 532, respectively. A portion of the metal fuse 533 with a transitional dimension is formed between another portion of the metal fuse 534a and the metal line 530, to control the lengths of the stubs 534a and 534b. In other words, varying the design of the metal fuse portion 533 controls the blown location of the metal fuse. Of course, all the features of the metal fuse in FIGS. 5A-C may be in combination in various embodiments of the present disclosure.

Referring to FIGS. 6A-D, illustrated are schematic cross-sectional views of a semiconductor device 600 at various stages of fabrication according to various aspects of the present disclosure. Also, FIGS. 6A through 6D are simplified for a better understanding of the inventive concepts of the present disclosure.

Figure 6A:
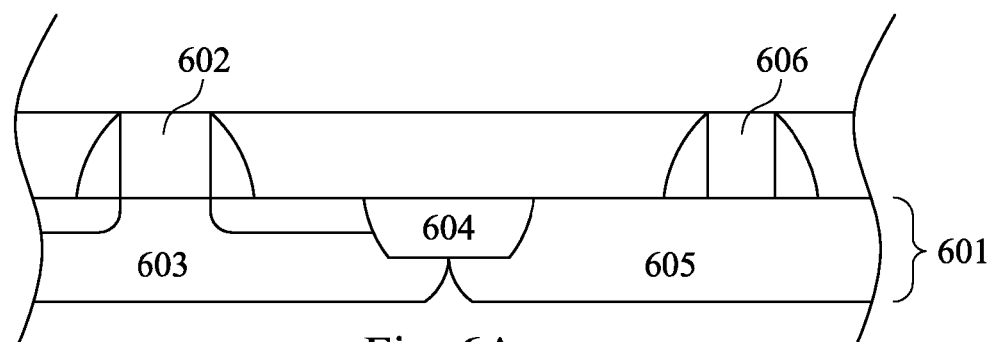
FIGS. 6A-D are cross-sectional views of a part of a semiconductor device at various stages of fabrication according to various embodiments of the present disclosure.

Referring to FIG. 6A, a substrate 601 includes an active region 603 and an isolation region 604. In various embodiments, the substrate 601 is a crystalline silicon substrate (e.g., wafer). The substrate 601 may include various doping configurations depending on design requirements (e.g., p-type substrate or n-type substrate). Further, the substrate 601 may include an epitaxial layer (epi layer), may be strained for performance enhancement, and/or may include a silicon-on-insulator (SOI) structure.

The active region 603, which refers to source, drain and those under gate. includes various doping configurations depending on design requirements. The active region 603 is doped with p-type or n-type dopants. For example, the active region 603 may be doped with p-type dopants, such as boron or $BF_2$; n-type dopants, such as phosphorus or arsenic; and/or combinations thereof. The active region 603 may act as a region configured for a gate stack 602 of an N-type metal-oxide-semiconductor transistor device (referred to as an NMOS) or regions configured for a P-type metal-oxide-semiconductor transistor device (referred to as a PMOS). Although the figures includes one gate structure 603 for the semiconductor device 600, it is understood the Integrated circuit (IC) may include a number of gate structures and other devices including resistors, capacitors and inductors, etc. Further, LDD regions (not shown) may be formed in the active region 603 of the substrate 601 by one or more implantation processes, such as an ion implantation process. The doping species may depend on the type of device being fabricated, such as an NMOS or PMOS device.

The isolation region 604 is formed in the substrate 601 to isolate the active region 603 and the dummy feature 605. The isolation region 604 may utilize isolation technology, such as local oxidation of silicon (LOCOS) or shallow trench isolation (STI), to define and electrically isolate the active region 603 and the part of the dummy feature 605 in the substrate. According to various embodiments, the isolation region 604 includes a STI. The isolation region 604 may comprise silicon oxide, silicon nitride, silicon oxynitride, fluoride-doped silicate glass (FSG), a low dielectric constant (low-k) dielectric material, other suitable materials, or combinations thereof. The isolation region 604 is formed by any suitable process. As one example, the formation of an STI may include patterning the semiconductor substrate 601 by a photolithography process, etching a trench in the substrate 601 (for example, by using a dry etching or wet etching), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIG. 6A, a dummy gate 606, as a part of the dummy feature 605, is defined by sequentially depositing and patterning a dummy oxide layer and a dummy gate electrode layer along with the formation of the gate stack 603 on the substrate 601. The dummy gate 606 is grounded through the doped well (i.e. the dummy feature 605) in the substrate 601 as well as an electrode (not shown) that is grounded. The dummy gate 606 may be formed using any suitable process, including the processes such as a thermal oxidation process and a low-pressure chemical vapor deposition (LPCVD) process.

Figure 6B:
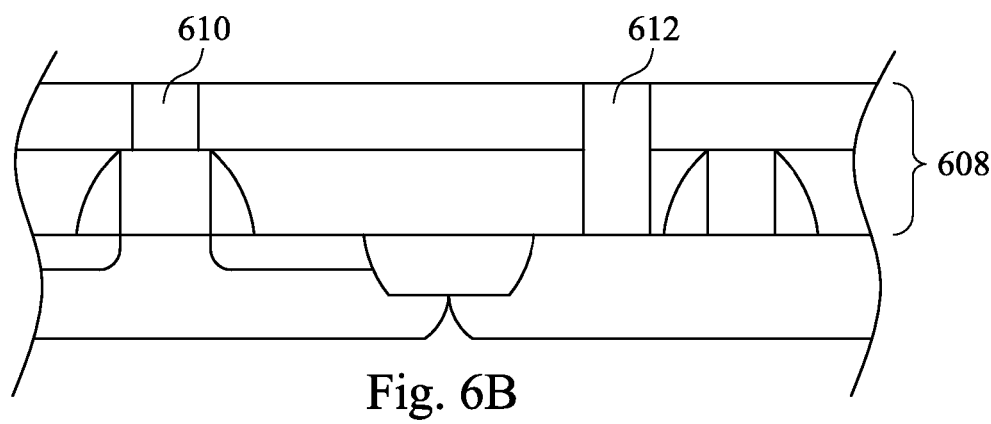

Referring to FIG. 6B, a first electrical contact 610 is formed on the gate stack 602 and a second electrical contact 612 is formed and electrically connected to the grounded dummy feature 605. An interlayer dielectric (ILD) layer 608 is formed over the substrate 601. The ILD layer 608 may be a dielectric material, including silicon oxide, spin-on glass (SOG), fluorinated silica glass (FSG), carbon doped silicon oxide (e.g., SiCOH), BLACK DIAMOND® (Applied Materials of Santa Clara, Calif.), other suitable dielectric materials, and/or combinations thereof. According to some embodiments, ILD layer 608 has a thickness in the range of about 4,000 angstroms to about 8,000 angstroms. It is understood that the ILD layer 608 may include one or more dielectric materials and/or one or more dielectric layers. Then, a layer of photoresist (not shown) is formed over the ILD layer 608 by a suitable process, such as spin-on coating, and patterned to form a patterned photoresist feature by a lithography patterning method. The patterned photoresist feature can then be transferred using a dry etching process to etch an opening for contacts through the dielectric layer 608. The photoresist layer is stripped thereafter.

As examples, the second electrical contact 612 is off-set from the dummy gate 606, as shown in FIGS. 2A, 3A and 4A.

Figure 6C:
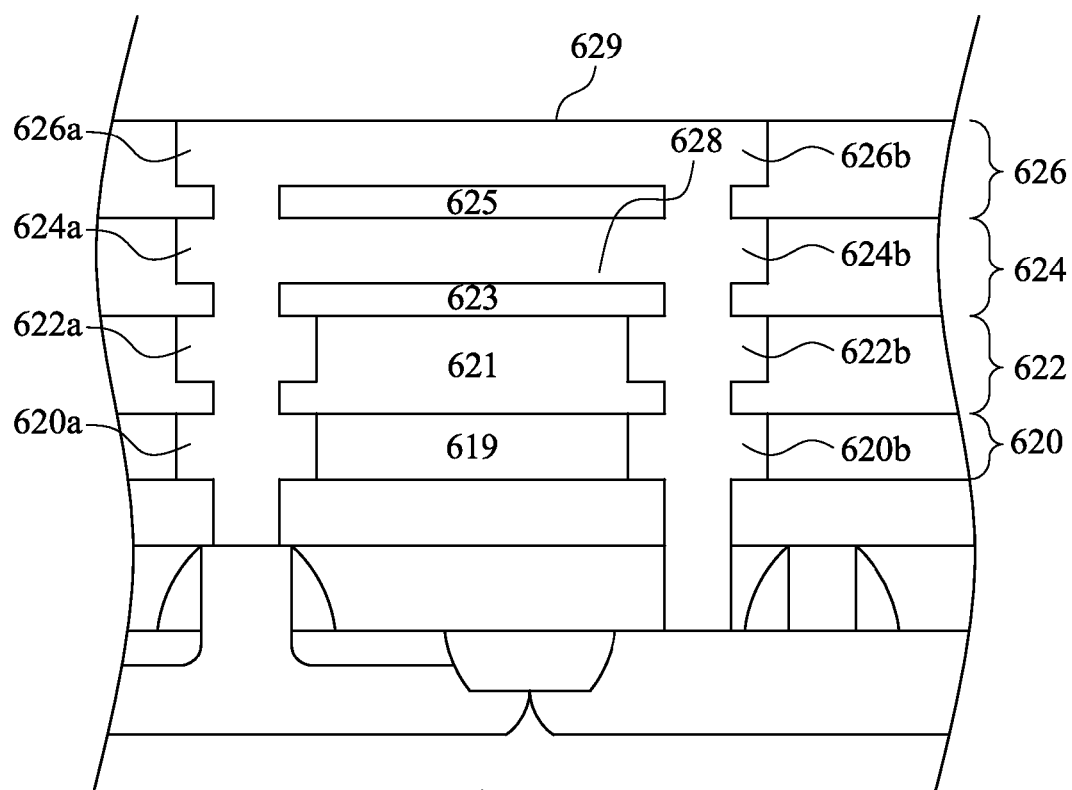

Referring to FIG. 6C, a plurality of metal layers (620, 622, 624, 626) and intermetal dielectric layers (619, 621, 623, 625) are deposited alternatively and patterned. Each of the patterned metal layers has a first metal pattern (620a, 622a, 624a, 626a) and a second metal pattern (620b, 622b, 624b, 626b) electrically connected to the first contact 610 and the second contact 612, respectively. It is noted that the drawing is simplified and the metal patterns are not necessarily in direct overlay with the respective upper and lower metal layers. The intermetal dielectric layers may is a dielectric material. The dielectric material may comprise silicon oxide, spin-on glass (SOG), fluorinated silica glass (FSG), carbon doped silicon oxide (e.g., SiCOH), BLACK DIAMOND® (Applied Materials of Santa Clara, Calif.), other suitable dielectric materials, and/or combinations thereof. The respective intermetal dielectric layers have any suitable thickness. The intermetal dielectric layers may include one or more dielectric materials and/or one or more dielectric layers. The metal fuse may be formed by any suitable process including photoresist and wet/dry etching process.

Still referring to FIG. 6C, following formation of the metal layer 624, a metal fuse 628 is formed between the first metal pattern 624a and the second metal pattern 624b. According to various embodiments of the present disclosure, the metal fuse 628 is blown by a plasma charge surging accumulated during a plasma etching process. In this regard, the metal fuse is one-fifth to one-tenth of the metal features in width dimension. Alternatively, the metal fuse 628 is partially removed by a wet or dry etching process so as to break the metal fuse 628. As a result, matching stubs are left on both sides of the metal patterns 624a and 624b. Similarly, following formation of the metal layer 626 as a topmost layer of the patterned metal layers, a metal fuse 629 may be formed between the first metal pattern 626a and the second metal pattern 626b, and then be broken by a suitable process.

Figure 6D:
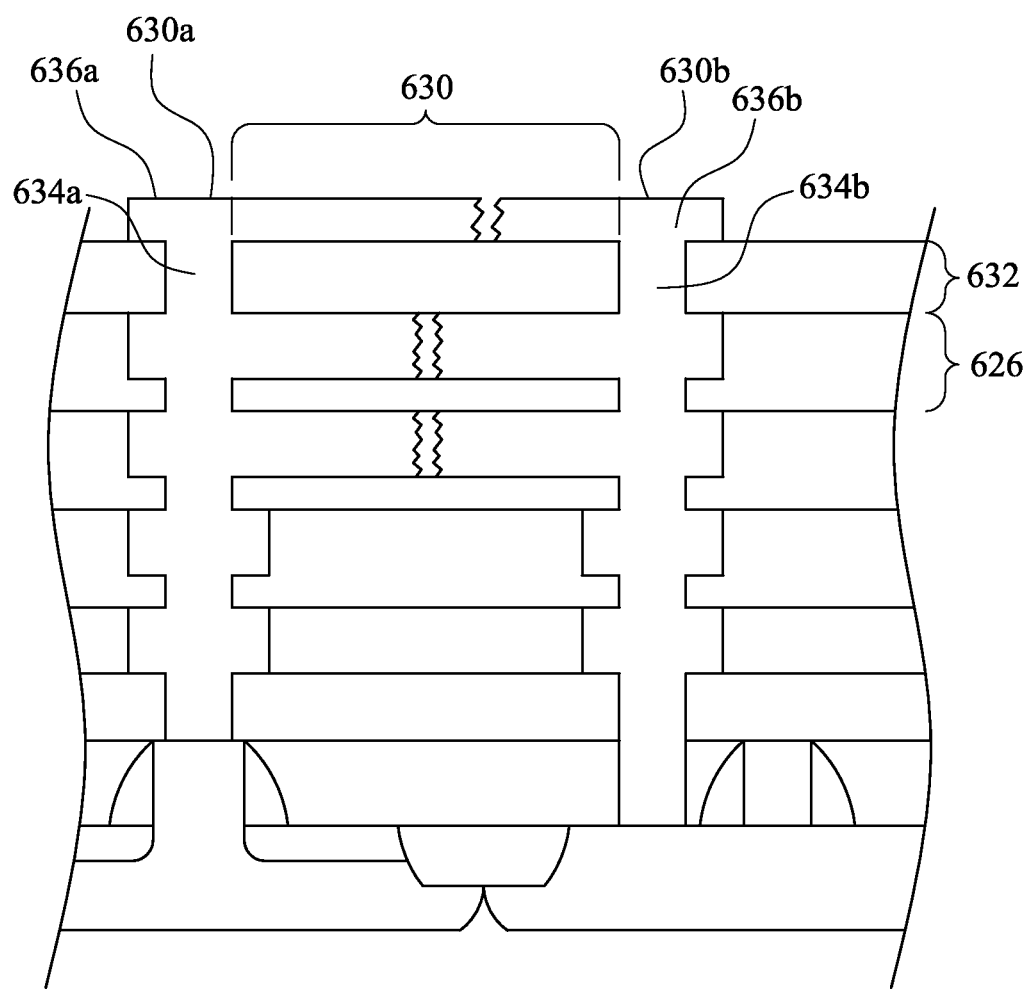

FIG. 6D shows the semiconductor device 600 after a passivation layer 632 is deposited over the topmost metal layer 626. It is noted that one or more passivation layers can optionally be formed, and each of the passivation layer includes a silicon nitride or a silicon oxide material, or combinations thereof. The passivation layer 632 is formed by a process that may include chemical vapor deposition (CVD), physical vapor deposition (PVD), atomic layer deposition (ALD), combination thereof, or another suitable process. The passivation layer 632 provides a sealing function for active components such as Field Effect Transistors (FETs) or Bipolar Junction Transistors (BJTs), or passive components such as resistors, capacitors, or inductor, so that they are less likely to be eroded or damaged by expernal components. The passivation layer 632 may be patterned and metal pads are deposited therein as a re-distribution layer (RDL). The metal pads may be formed on the passivation layer 632 as shown in FIG. 6D. A metal fuse 630 may be formed between the first metal pad 636a and the second metal pad 636b. According to embodiments of the present disclosure, the metal fuse 630 is blown into two matching stubs 630a and 630b by a plasma charge accumulated during a plasma etching process. In this regard, the metal fuse is one-fifth to one-tenth of the metal features in width dimension. Alternatively, the metal fuse 630 is partially removed by a wet or dry etching process so as to break the metal fuse 630. As a result, matching stubs are left on both sides of the metal patterns 636a and 636b, as that also illustrated in FIGS. 5A-5C in various broken fuse configurations therebetween.

Figure 7:
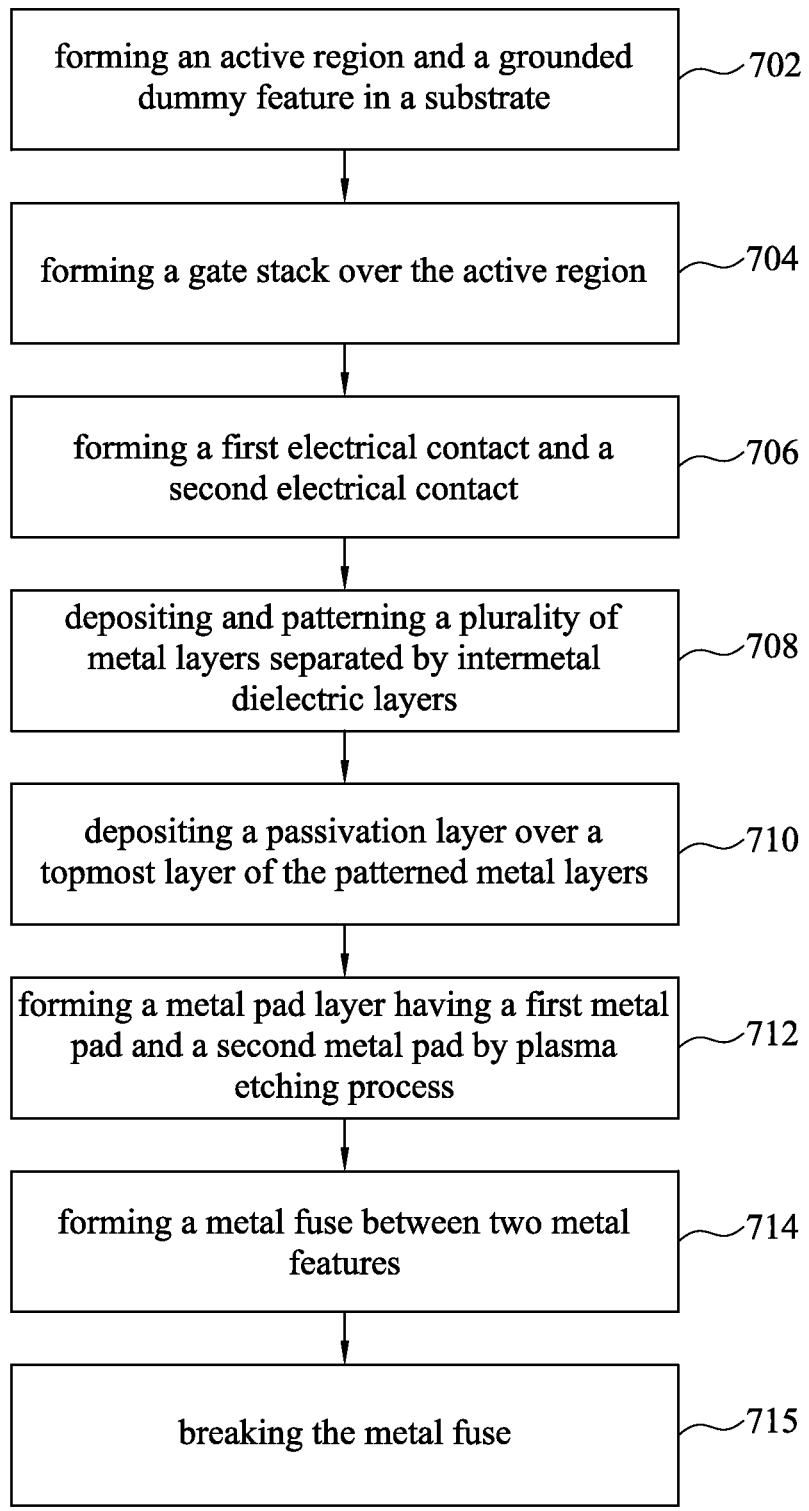
FIG. 7 is a flowchart of a method of fabricating a semiconductor device according to various embodiments of the present disclosure.

FIG. 7 is a flowchart of a method 700 of fabricating a semiconductor device according to various aspects of the present disclosure. It is understood that additional processes may be provided before, during, and after the method 700 of FIG. 7, and that some other processes may only be briefly described herein. In operation 702, an active region is formed in a substrate. The active region normally stands for source, drain and those under a gate. As shown in FIG. 6A, the active region 603 includes various doping configurations depending on design requirements. For example, the active region is doped with p-type or n-type dopants, such as boron or $BF_2$; n-type dopants, such as phosphorus or arsenic; and/or combinations thereof.

In operation 704, a gate stack and a grounded dummy feature are formed over the active region. Referring to FIG. 6A, the dummy gate 606, as a part of the dummy feature 605, is defined by sequentially depositing and patterning a dummy oxide layer and a dummy gate electrode layer along with the formation of the gate stack 603 on the substrate 601. The dummy gate 606 is grounded through the doped well (i.e. the dummy feature 605) in the substrate 601 as well as an electrode (not shown) that is grounded. The dummy gate 606 may be formed using any suitable process, including the processes such as a thermal oxidation process and a low-pressure chemical vapor deposition (LPCVD) process.

In operation 706, a first electrical contact is formed on the gate stack and a second electrical contact is formed that is electrically connected to the grounded dummy feature. Referring to FIG. 6B, a layer of photoresist (not shown) is first formed over the ILD layer 608 by a suitable process, such as spin-on coating, and patterned to form a patterned photoresist feature by a lithography patterning method. The patterned photoresist feature can then be transferred using a dry etching process to etch an opening for contacts through the dielectric layer 608. The metal contacts 610 and 612 can be formed based on the patterned photoresist feature, and the photoresist layer is stripped thereafter.

In operation 708, a plurality of metal layers are deposited and patterned which the metal layers are separated by intermetal dielectric layers. Referring to FIGS. 6B and 6C, each of the patterned metal layers has a first metal pattern (620a, 622a, 624a, 626a) electrically connected to the first contact (610). Further, each of the patterned metal layers has a second metal pattern (620b, 622b, 624b, 626b) electrically connected to the second contact (612).

In operation 710, a passivation layer is deposited over a topmost layer of the patterned metal layers. Referring to FIG. 6D, the passivation layer 632 is deposited by a process that may include CVD, PVD, ALD, combination thereof, or another suitable process.

In operation 712, a metal pad layer is formed having a first metal pad electrically connected to the first electrical contact, and a second metal pad is electrically connected to the second metal pad by a plasma etching process. Referring to FIG. 6D, the first metal pad 636a and the second metal pad 636b is deposited and electrically connected to the first electrical contact 610 and the second electrical contact 612, respectively.

In operation 714, a metal fuse is formed between two metal features. As embodiments of the present disclosure, the two metal features are the first metal pad and the second metal pad, or the first metal pattern and the second metal pattern in one of the plurality of patterned metal layers. The metal fuse (628, 629, 630) breakage, connects the first metal pad and the second metal pad (624a, 624b; 626a, 626b; 636a, 636b).

In operation 716, the metal fuse between the two metal features is broken or blown as the above mentioned by referring to FIG. 6D.

In summary, the various embodiments of the present disclosure the semiconductor device with the metal (e.g., Al) fuse, which provides a path for plasma charge to ground through the dummy feature, so as to eliminate plasma induced damage (PID) effect. Since the protection of the metal fuse works at the beginning stage of the plasma generation in the fabrication of the semiconductor device, it soundly protects circuitry formed subsequently.

Although the present disclosure has been described in considerable detail with reference to certain embodiments thereof, other embodiments are possible. Therefore, the spirit and scope of the appended claims should not be limited to the description of the embodiments contained herein.

It will be apparent to those ordinarily skilled in the art that various modifications and variations may be made to the structure of the present disclosure without departing from the scope or spirit of the disclosure. In view of the foregoing, it is intended that the present disclosure cover modifications and variations thereof provided they fall within the scope of the following claims.

What is claimed is:

1. A semiconductor device comprising:
   a substrate having an active region and a grounded dummy feature formed in the substrate;
   a gate stack formed over the active region;
   a first electrical contact in contact with the gate stack and a second electrical contact electrically connected to the dummy feature;
   a plurality of patterned metal layers, each of the patterned metal layers comprising a first metal pattern and a second metal pattern electrically connected to the first contact and the second contact, respectively, and the first metal pattern and second metal pattern separated by intermetal dielectric layers;
   a passivation layer over a topmost patterned metal layer of the plurality of patterned metal layers;
   a first metal pad electrically connected to the first electrical contact, and a second metal pad electrically connected to the second electrical contact; and
   a metal fuse connecting two metal features, wherein the first of two metal features is directly connected to the first electrical contact and the second of two metal features is directly connected to the second electrical contact, and the two metal features are the first metal pad and the second metal pad, or the first metal pattern and the second metal pattern in one of the plurality of patterned metal layers.

2. The semiconductor device of claim 1, wherein the dummy feature is a first conductive type well.

3. The semiconductor device of claim 1, wherein the metal fuse is one-fifth to one-tenth of the metal features in width dimension.

4. The semiconductor device of claim 1, wherein the two metal features are the first metal pattern and the second metal pattern at the topmost patterned metal layer.

5. The semiconductor device of claim 1, wherein the two metal features are the first metal pad and the second metal pad on the passivation layer.

6. The semiconductor device of claim 1, wherein the metal fuse is made of material same as or different from that of the first metal pad and the second metal pad.

7. The semiconductor device of claim 6, wherein the metal fuse is made of aluminum (Al), copper (Cu), or AlCu.

8. The semiconductor device of claim 1, wherein the metal fuse has varying widths along the metal fuse length.

9. The semiconductor device of claim 1, wherein the metal fuse includes a bottle neck.

10. The semiconductor device of claim 1, wherein the two metal features are the first metal pad and the second metal pad in the passivation layer.

11. The semiconductor device of claim 1, further comprising an isolation region in the substrate isolating the active region under the gate stack and the grounded dummy feature.

12. The semiconductor device of claim 1, further comprising an interlayer dielectric layer over the substrate.

13. A semiconductor device comprising:
    a substrate having an active region and a grounded dummy feature formed in the substrate;
    a gate stack formed over the active region;
    a dielectric material layer over the substrate and the gate stack;
    a first electrical contact in contact with the gate stack and a second electrical contact electrically connected to the dummy feature;
    a plurality of patterned metal layers, each of the patterned metal layers having a first metal pattern and a second metal pattern electrically connected to the first contact and the second contact, respectively, and the first metal pattern and second metal pattern separated by intermetal dielectric layers;
    a passivation layer over a topmost layer of the patterned metal layers;
    a first metal pad electrically connected to the first electrical contact, and a second metal pad electrically connected to the second electrical contact; and
    matching stubs on two metal features, wherein the first of two metal features is directly connected to the first electrical contact and the second of two metal features is directly connected to the second electrical contact, and the two metal features are the first metal pad and the second metal pad, or the first pattern and the second pattern in one of the plurality of patterned metal layers.

14. The semiconductor device of claim 13, wherein the dummy feature is a first conductive type well.

15. The semiconductor device of claim 13, wherein the matching stubs are one-fifth to one-tenth of the metal features in width dimension.

16. The semiconductor device of claim 13, wherein the two metal features are the first metal pattern and the second metal pattern at the topmost layer.

17. The semiconductor device of claim 13, wherein the two metal features are the first metal pad and the second metal pad in or on the passivation layer.

18. The semiconductor device of claim 13, further comprising an isolation region in the substrate isolating the active region under the gate stack and the grounded dummy feature.

19. The semiconductor device of claim 18, wherein the isolation region comprises silicon oxide, silicon nitride, silicon oxynitride, fluoride-doped silicate glass (FSG), a low dielectric constant (low-k) dielectric material, or combinations thereof.

20. The semiconductor device of claim 13, further comprising an interlayer dielectric layer over the substrate.

* * * * *